United States Patent
Lin et al.

(10) Patent No.: US 12,082,514 B2
(45) Date of Patent: Sep. 3, 2024

(54) LEAD-FREE METALLIC HALIDE MEMRISTOR AND ELECTRONIC ELEMENT COMPRISING THE SAME

(71) Applicant: National Tsing Hua University, Hsinchu (TW)

(72) Inventors: Hao-Wu Lin, Hsinchu (TW); Tsung-Kai Su, Taichung (TW); Wei-Kai Cheng, Hsinchu (TW); Cheng-Yueh Chen, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 415 days.

(21) Appl. No.: 17/580,481

(22) Filed: Jan. 20, 2022

(65) Prior Publication Data
US 2023/0165172 A1    May 25, 2023

(30) Foreign Application Priority Data
Nov. 24, 2021  (TW) .................................. 110143741

(51) Int. Cl.
*H10N 70/00*    (2023.01)
*G06N 3/065*    (2023.01)
(Continued)

(52) U.S. Cl.
CPC .......... *H10N 70/881* (2023.02); *G06N 3/065* (2023.01); *H10B 63/80* (2023.02); *H10N 70/24* (2023.02); *H10N 70/841* (2023.02)

(58) Field of Classification Search
None
See application file for complete search history.

(56) References Cited

U.S. PATENT DOCUMENTS

| | | | | |
|---|---|---|---|---|
| 8,537,599 B2 * | 9/2013 | Srinivasan | ........... | G11C 13/003 365/189.16 |
| 9,147,615 B2 * | 9/2015 | Afzali-Ardakani | ........................ | H01L 29/267 |

(Continued)

FOREIGN PATENT DOCUMENTS

| | | | | |
|---|---|---|---|---|
| CN | 101114695 B | * | 4/2011 | ............. B82Y 10/00 |
| CN | 105934807 A | * | 9/2016 | ............... C09D 1/00 |
| TW | 202103347 | | 1/2021 | |

OTHER PUBLICATIONS

Search Report for Taiwan counterpart application TW110143741, date Mar. 23, 2022.
(Continued)

*Primary Examiner* — Scott B Geyer

(57) ABSTRACT

A lead-free metallic halide memristor is disclosed. The lead-free metallic halide memristor comprises a first electrode layer, an active layer and a second electrode layer, of which the active layer is made of a metallic halide material. Experimental data have proved that the lead-free metallic halide memristor possesses synaptic plasticity because of showing characteristics of short-term potentiation, short-term depression, long-term potentiation, long-term depression during the experiments. Therefore, the lead-free metallic halide memristor has significant potential for being used as an artificial synaptic element so as to be further applied in the manufacture of a reservoir computing chip. Moreover, experimental data have also proved that the lead-free metallic halide memristor also shows the characteristics of multi-level resistive switching, whereupon the lead-free metallic halide memristor can be further used as analog non-volatile memory so as to be further applied in the manufacture of a neuromorphic computing chip.

7 Claims, 11 Drawing Sheets

(51) Int. Cl.
*H10B 63/00* (2023.01)
*H10N 70/20* (2023.01)

(56) References Cited

U.S. PATENT DOCUMENTS

| | | | |
|---|---|---|---|
| 2011/0199815 A1* | 8/2011 | Meade | G11C 13/0007 |
| | | | 257/532 |
| 2017/0124449 A1* | 5/2017 | Cario | G06N 3/065 |
| 2018/0006253 A1* | 1/2018 | Kirsch | H10K 10/50 |
| 2019/0189919 A1* | 6/2019 | Jung | H10N 70/8836 |
| 2020/0357990 A1* | 11/2020 | Kim | H10B 63/00 |
| 2022/0069206 A1* | 3/2022 | Cheng | H10N 70/245 |
| 2023/0006158 A1* | 1/2023 | Griffith | H01L 31/0481 |

OTHER PUBLICATIONS (English translation) Search Report for Taiwan counterpart application TW110143741, date Mar. 23, 2022.

* cited by examiner

LEAD-FREE METALLIC HALIDE MEMRISTOR AND ELECTRONIC ELEMENT COMPRISING THE SAME

BACKGROUND OF THE INVENTION

1. Field of the Invention

The present invention relates to the technology field of memristor elements, and more particularly to a lead-free metallic halide memristor.

2. Description of the Prior Art

With reference to FIG. 1, there is shown a block diagram for describing a traditional Von Neumann architecture. Von Neumann architecture 1a is also called Princeton architecture, and comprises a control unit 11a, an arithmetic logic unit (ALU) 12a, a memory 13a, an input unit 14a, and an output unit 15a. Nowadays, a computer having the Von Neumann architecture 1a is regarded as a stored program computer, whereof at least one application program and/or the data are stored in the memory 13a, and the control unit 11a control the ALU 12a to access the memory 13a to conduct the application program, read out the stored data, or write new data into the memory 13a.

Engineers skilled in field of computer science certainly know that there is a system bottleneck existing in the computer having the Von Neumann architecture 1a. In case of the occurrence of the system bottleneck, the computing throughput of the computer is limited due to inadequate rate of data transfer between the memory 13a and the ALU 12a. It is worth explaining that, the term "Von Neumann bottleneck" was coined by John Backus in 1978 for being representative of the forgoing system bottleneck.

Therefore, because of failing to conduct AI computing and store huge data simultaneously, the Von Neumann architecture 1a is found not applicable to being the principal framework of a specific computer that is particularly used in conducting image recognition and/or voice recognition. Accordingly, a fast and low power consumption computing framework using artificial neural network (ANN) is developed, and is further adopted for replacing the ALU 12a and the memory 13a as shown in FIG. 1. For example, FIG. 2 shows a block diagram for describing a computer having neuromorphic computing architecture 1b, comprising: a control unit 11b, an ANN unit 12b, an input unit 14b, and an output unit 15b. During a normal operation of the neuromorphic computing architecture 1b, the ANN unit 12b succeeds in conducting AI computing and store huge data simultaneously according to the controlling command transmitted from the control unit 11b. As a result, compared to the computer having Von Neumann architecture 1a (as shown in FIG. 1), the computer having neuromorphic computing architecture 1b exhibits advantages of high performance, low computing time, and low power consumption.

Synapses are specialized to transduce signals from one neuron to another, either via chemical neurotransmitters or, less commonly, by electrical coupling. A typical neuron in the mammalian brain may receive and extend 10,000 or more synapses, connecting it with numerous neurons close by or far away. The adult human brain is estimated to contain more than $10^{11}$ neurons and $10^{14}$ (100 trillion) synapses, with a density of approximately one billion synapses per cubic millimeter of cerebral cortex. Recently, a special type of memristor was considered to be able to mimic the behavior of neural synapses. In particular, attributed to the short-term and long-term memory of weight changes, the memristor is found to possess the synaptic plasticity. Furthermore, a variety of memristors including advantages of small size, high switching speed and low power consumption have been developed, thereby being used as artificial synapses for constituting the ANN unit 12b as shown in FIG. 2.

It is worth mentioning that, literature 1 has disclosed a computing system having aforesaid neuromorphic computing architecture. The disclosed computing system is called reservoir computing system, and is able to conduct AI computing and store huge data simultaneously. Herein, literature 1 is written by Du et.al, and is entitled with "reservoir computing using dynamic memristors for temporal information processing" so as to be published on Nat Commun 8, 2204 (2017). According to the disclosures of literature 1, the reservoir computing system has a dynamic reservoir comprising a plurality of memristors, and exhibits short-term memory to project features from the temporal inputs into a high-dimensional feature space. A readout function layer can then effectively analyze the projected features for tasks, such as classification and time-series analysis. The reservoir computing system can efficiently compute complex and temporal data with low-training cost, since only the readout function needs to be trained. Experimental data have proved that, even though the dynamic reservoir only consists of 88 memristors, the internal ionic dynamic processes of memristors allow the dynamic reservoir to directly process information in the temporal domain. Consequently, the reservoir computing system can already be used for tasks, such as handwritten digit recognition.

Engineers skilled in design and manufacture of non-volatile memories (NVM) should know that a memristor principally comprises a bottom electrode, an active layer and a top electrode. For example, U.S. patent publication No. 2018/0351095 A1 has disclosed a memristor, which consists of a Pt-made bottom electrode, an active layer comprising an amorphous SrTiO film and an amorphous $SrTiO_{3-x}$ film, and a Pt-made top electrode. According to the disclosures of U.S. patent publication No. 2018/0351095 A1, as long as an operation voltage applied to the memristor exceeds 1 V, the memristor is allowed to be switched from a low resistance state (LRS) to a high resistance state (HRS). In other words, the aforesaid conventional memristor shows a practical drawback of high switching voltage.

On the other hand, U.S. Pat. No. 10,186,660 B2 has disclosed another one type of memristor which consisting of a Pt-made bottom electrode, an active layer made of $HfO_2$, and a Ta-made top electrode. According to FIG. 3C of U.S. Pat. No. 10,186,660 B2, it is found that, after the memristor receives a treatment of continuously multi-level resistance modulation, there is merely one order of resistance ratio between the HRS and the LRS of the memristor In other words, the aforesaid conventional memristor shows a practical drawback of narrow dynamic range.

According to above descriptions, it is understood that there are rooms for improvement in the conventional memristor-based artificial synapse and the conventional memristor-based non-volatile memory. In view of that, the inventor of the present application have made great efforts to make inventive research and eventually provided a lead-free metallic halide memristor.

SUMMARY OF THE INVENTION

The primary objective of the present invention is to disclose a lead-free metallic halide memristor. The lead-free metallic halide memristor comprises a first electrode layer, an active layer and a second electrode layer, of which the active layer is made of a metallic halide material. Experimental data have proved that the lead-free metallic halide memristor possesses synaptic plasticity because of showing characteristics of short-term potentiation (STP), short-term depression (STD), long-term potentiation (LTP), long-term depression (LTD) during the experiments. Therefore, the lead-free metallic halide memristor has significant potential for being used as an artificial synaptic element so as to be further applied in the manufacture of a reservoir computing chip. Moreover, experimental data have also proved that the lead-free metallic halide memristor also shows the characteristics of multi-level resistive switching, whereupon the lead-free metallic halide memristor can be further used as analog non-volatile memory so as to be further applied in the manufacture of a neuromorphic computing chip.

For achieving the primary objective mentioned above, the present invention provides an embodiment of the lead-free metallic halide memristor, comprising:
 a first electrode layer;
 an active layer, being formed on the first electrode layer; and
 a second electrode layer, being formed on the active layer;
 wherein the active layer is made of a metallic halide material comprising a general formula $MX_n$;
 wherein M is selected from a group consisting of Li, Na, K, Rb, Cs, Mg, and X being selected from a group consisting of F, Cl, Br, and I;
 wherein n is 1 or 2.

In one embodiment, the first electrode layer and the second electrode layer are both made of a material selected from a group consisting of silver, gold, platinum, copper, indium tin oxide, fluorine-doped tin oxide, indium zinc oxide, gallium doped zinc oxide, and aluminum-doped zinc oxide.

In one embodiment, the first electrode layer is made of a material, and the material is a compound of silver and titanium carbide.

In one embodiment, the first electrode layer is formed on a substrate.

In one practicable embodiment, there is an interfacial modification layer formed between the first electrode layer and the active layer, and the interfacial modification layer is made of a material selected from a group consisting of oxide semiconductor and organic semiconductor.

In another one practicable embodiment, there is an interfacial modification layer formed between the active layer and the second electrode layer, and the interfacial modification layer is made of a material selected from a group consisting of oxide semiconductor and organic semiconductor.

In other practicable embodiments, a first interfacial modification layer is formed between the first electrode layer and the active layer, a second interfacial modification layer is formed between the active layer and the second electrode layer, and the first interfacial modification layer and the second interfacial modification layer are both made of a material selected from a group consisting of oxide semiconductor and organic semiconductor.

Moreover, the present invention also discloses an electronic element, which is selected from a group consisting of artificial synapse, two-level resistive non-volatile memory and multi-level resistive non-volatile memory, and is characterized in comprising the aforesaid first electrode layer, active layer and second electrode layer.

Furthermore, the present invention also discloses an electronic chip, which is selected from a group consisting of neuromorphic computing chip and reservoir computing chip, and is characterized in comprising multiple aforesaid lead-free metallic halide memristors.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a lead-free metallic halide memristor and an electronic element comprising the same, embodiments of the present invention will be described in detail with reference to the attached drawings hereinafter.

The present invention discloses a lead-free metallic halide memristor, which possesses synaptic plasticity because of showing characteristics of short-term potentiation (STP), short-term depression (STD), long-term potentiation (LTP), long-term depression (LTD) during operation. Moreover, the lead-free metallic halide memristor also shows characteristic of multi-level variable resistive memory. Therefore, the lead-free metallic halide memristor has a wide variety of uses, including being used as an electronic element like artificial synapse, two-level resistive non-volatile memory and multi-level resistive non-volatile memory, being applied in the manufacture of neuromorphic computing chip, and being applied in the manufacture of reservoir computing chip.

Figure 1:
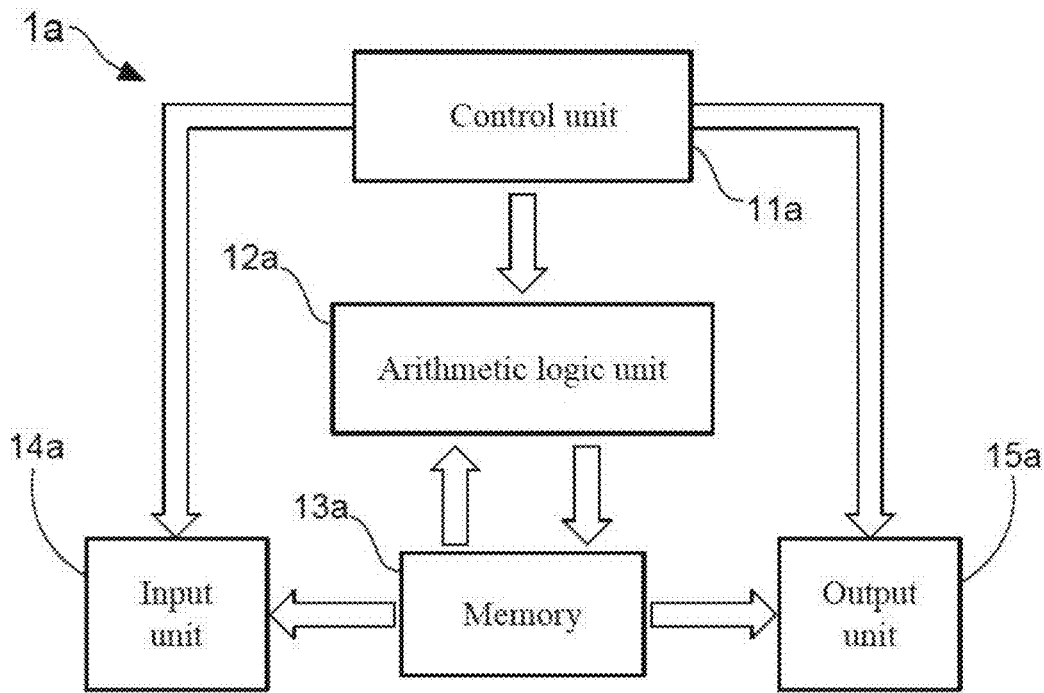
FIG. 1 shows a block diagram for describing a traditional Von Neumann architecture.
Figure 2:
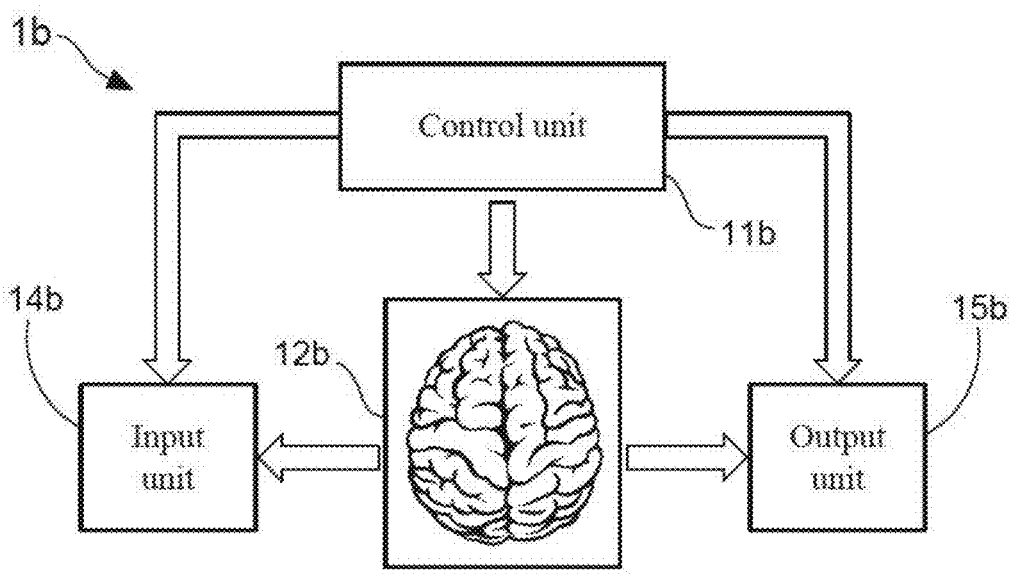
FIG. 2 shows a block diagram for describing a computer having neuromorphic computing architecture.
Figure 3:
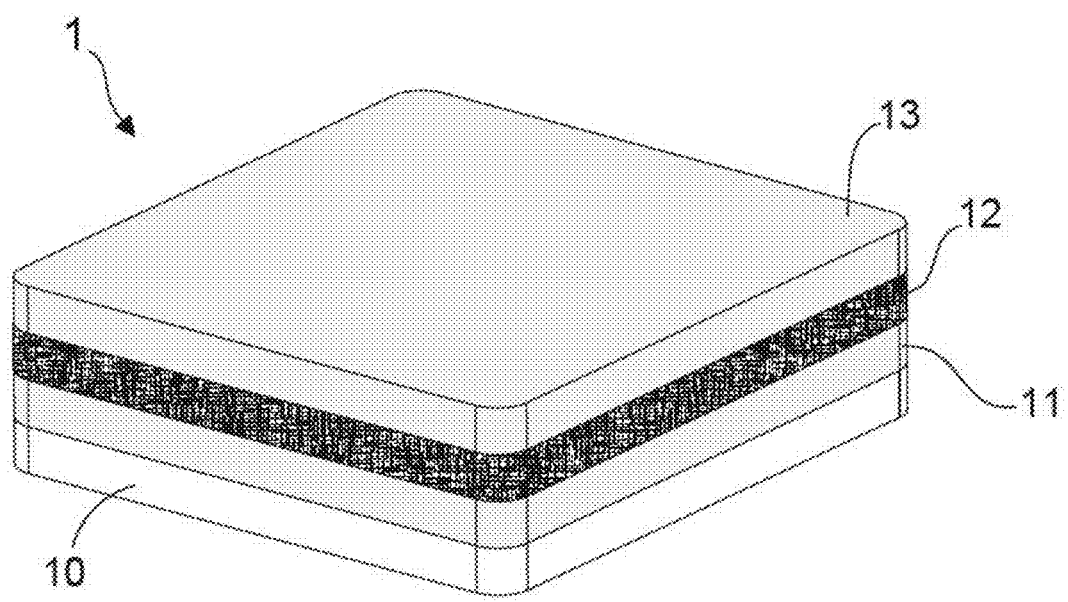
FIG. 3 shows a schematic elevation view of a lead-free metallic halide memristor according to the present invention.

With reference to FIG. 3, there is shown a schematic elevation view of a lead-free metallic halide memristor according to the present invention. As FIG. 3 shows, the lead-free metallic halide memristor 1 comprises: a first electrode layer 11, an active layer 12 and a second electrode layer 13. To fabricate this novel lead-free metallic halide memristor 1, it is firstly formed the first electrode layer 11 on a substrate 10, and then the active layer 12 and the second electrode layer 13 are formed on the first electrode layer 11 in turns. It is imaginable that there is a circuit topology formed on the substrate 10, whereupon a control circuit is coupled to the circuit topology, so as to drive at least one said lead-free metallic halide memristor 1 that is disposed on the substrate 10. According to the present invention, the active layer 12 is made of a metallic halide material comprising a general formula $MX_n$, of which M is any one of Li, Na, K, Rb, Cs, or Mg, and X is any one of F, Cl, Br, or I. In other words, M is an alkali metal element or an alkaline earth metal element, and X is a halogen element. On the other hand, n is 1 or 2.

As described in more detail below, the first electrode layer 11 and the second electrode layer 13 are both made of a material, and the material can be any one of silver (Ag), gold (Au), platinum (Pt), copper (Cu), indium tin oxide (ITO), fluorine-doped tin oxide (FTO), indium zinc oxide (IZO), gallium doped zinc oxide (GZO), or aluminum-doped zinc oxide (AZO). It is worth mentioning that, in a particular embodiment, the first electrode layer 11 can be made of a compound of silver (Ag) and titanium carbide (TiC).

Figure 4A:
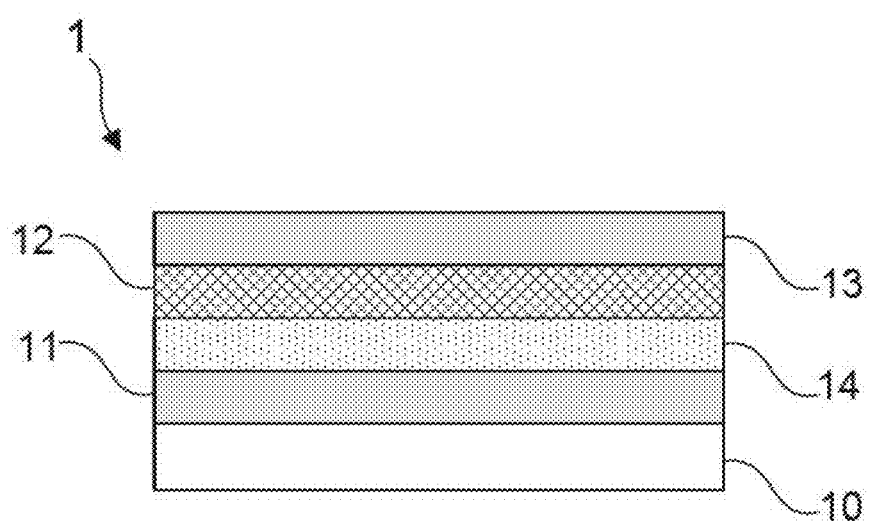
FIG. 4A shows a first cross-sectional side of the lead-free metallic halide memristor according to the present invention.
Figure 4B:
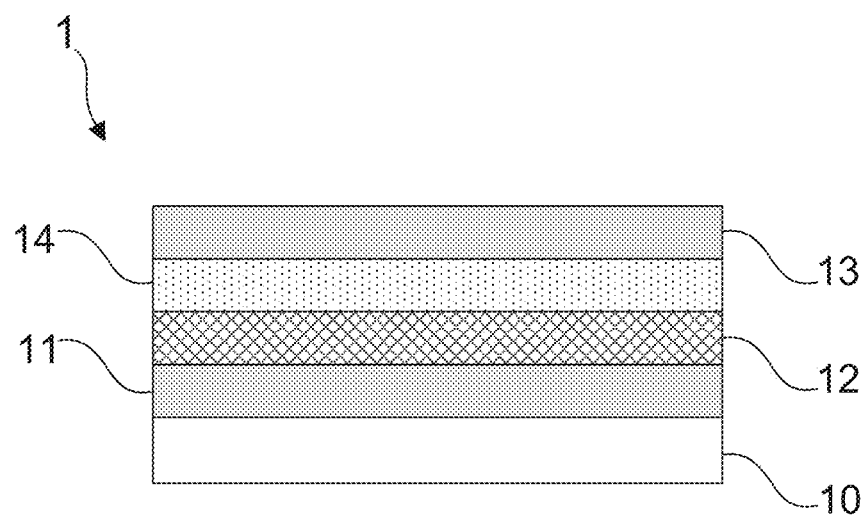
FIG. 4B shows a second cross-sectional side of the lead-free metallic halide memristor according to the present invention.
Figure 4C:
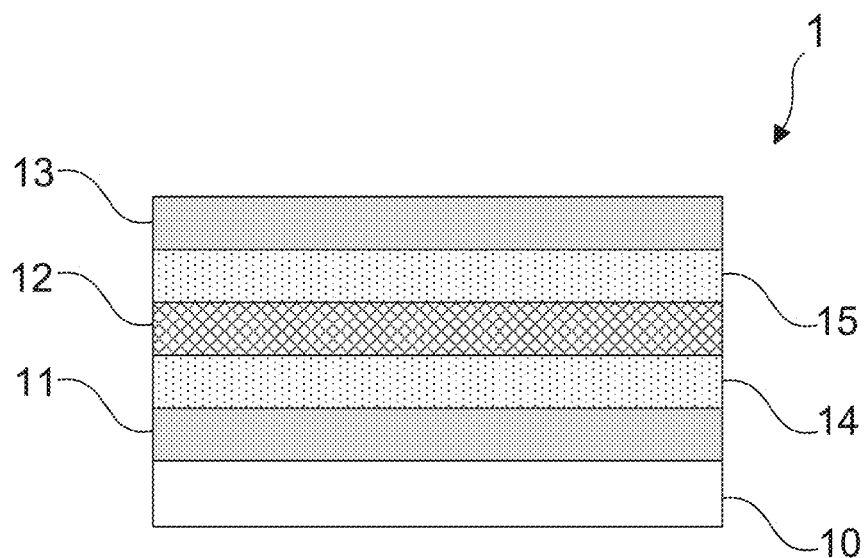
FIG. 4C shows a third cross-sectional side of the lead-free metallic halide memristor according to the present invention.

FIG. 4A, FIG. 4B, FIG. 4C show a first cross-sectional side, a second cross-sectional side and a third cross-sectional side of the lead-free metallic halide memristor, respectively. It is imaginable that there may be interfacial defects existing between the first electrode layer 11 and the $MX_n$-made active layer 12 and/or between the $MX_n$-made active layer 12 and the second electrode layer 13. In some applications, the interfacial defects would degrade the performance of the lead-free metallic halide memristor 1. Accordingly, for significantly reducing the impact of the interfacial defects, it is able to form a first interfacial modification layer 14 (as shown in FIG. 4A) between the first electrode layer 11 and the active layer 12. Moreover, as FIG. 4B shows, it may also dispose the first interfacial modification layer 14 between the active layer 12 and the second electrode layer 13. Furthermore, as FIG. 4C shows, it may also form a first interfacial modification layer 14 between the first electrode layer 11 and the active layer 12, and simultaneously form a second interfacial modification layer 15 between the active layer 12 and the second electrode layer 13. In practicable embodiments, the first interfacial modification layer 14 and the second interfacial modification layer 15 can both be made of an oxide semiconductor like MoOx or an organic semiconductor such as PEDOT:PSS.

Samples of the Lead-Free Metallic Halide Memristor

For proving that the lead-free metallic halide memristor 1 having the structure as shown in FIG. 3, FIG. 4A, FIG. 4B, or FIG. 4C can indeed show characteristics of multi-level resistive switching, short-term potentiation (STP), short-term depression (STD), long-term potentiation (LTP), and long-term depression (LTD), several samples of the lead-free metallic halide memristor 1 are made, and electrical characteristic measurements of these samples are all completed. There are ten samples of the lead-free metallic halide memristor 1 fabricated, and the basic information of the ten samples are provided in following Table (1).

TABLE (1)

| Sample No. | First electrode | First interfacial modification layer | Active layer | Second interfacial modification layer | Second electrode |
|---|---|---|---|---|---|
| 1 | ITO | — | CsI (200 nm) | — | Ag (130 nm) |
| 2 | ITO | — | CsBr (100 nm) | — | Ag (130 nm) |
| 3 | TiC/Ag (180 nm) | MoOx (20 nm) | NaCl (100 nm) | MoOx (20 nm) | Ag (140 nm) |
| 4 | ITO | — | CsC1 (100 nm) | — | Ag (130 nm) |
| 5 | Ag (100 nm) | — | CsBr (100 nm) | MoOx (20 nm) | Ag (130 nm) |
| 6 | Ag (100 nm) | MoOx (20 nm) | CsBr (100 nm) | — | Ag (130 nm) |
| 7 | Ag (100 nm) | MoOx (20 nm) | CsI (200 nm) | — | Ag (130 nm) |
| 8 | TiC/Ag (180 nm) | — | NaCl (100 nm) | — | Ag (130 nm) |
| 9 | TiC/Ag (180 nm) | — | MgF2 (100 nm) | MoOx (20 nm) | Ag (130 nm) |

In neuroscience, synaptic plasticity is the ability of synapses to strengthen or weaken over time, in response to increases or decreases in their activity. Since memories are postulated to be represented by vastly interconnected neural circuits in the brain, synaptic plasticity is one of the important neurochemical foundations of learning and memory. Data of electrophysiological experiments have indicated that characteristics of synaptic plasticity include facilitation, potentiation and depression. Moreover, the synaptic plasticity can further classified into short-term plasticity and long-term plasticity. Therefore, as long as the electrical characteristics of an electronic element exhibit the short-term plasticity and the long-term plasticity, the electronic element is regarded as an artificial synapse.

Figure 5:
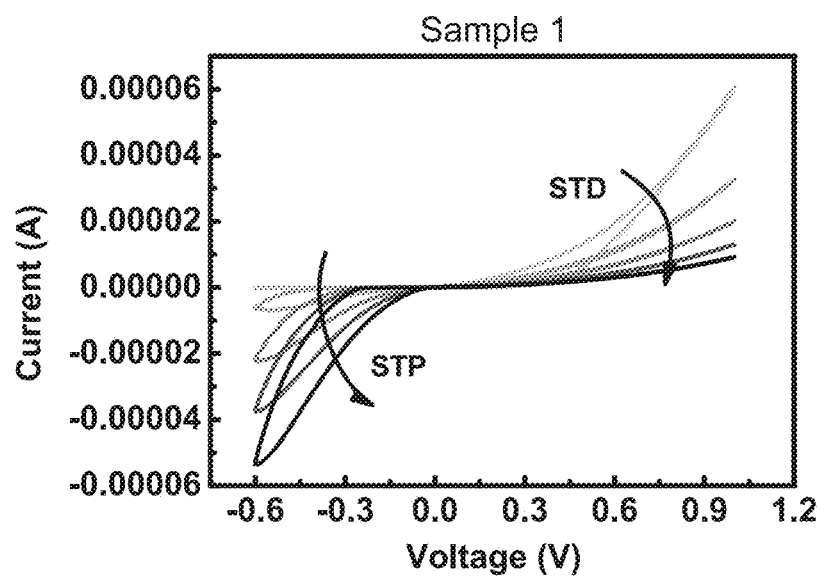
FIG. 5 shows a curve graph for showing I-V characteristics of a sample 1 of the lead-free metallic halide memristor.
Figure 6:
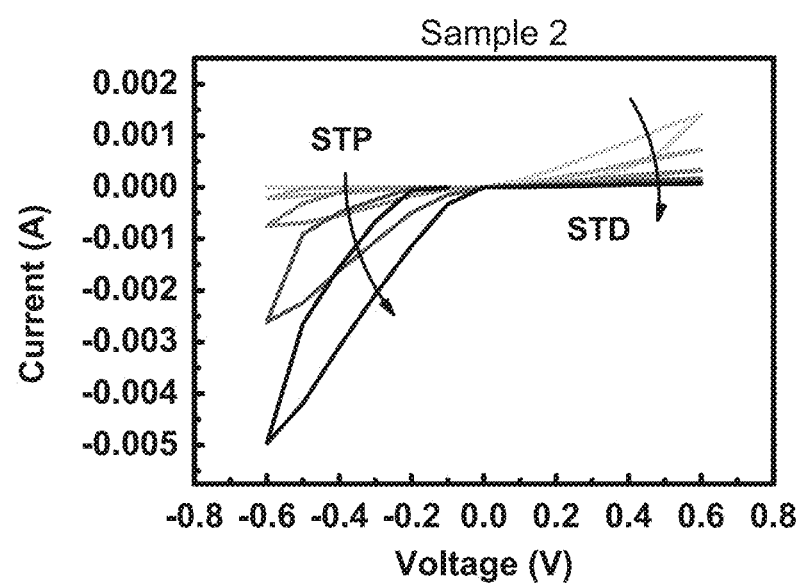
FIG. 6 shows a curve graph for showing I-V characteristics of a sample 2 of the lead-free metallic halide memristor.

FIG. 5 shows a curve graph for showing I-V characteristics of sample 1 of the lead-free metallic halide memristor 1. According to the I-V curve of FIG. 5, it is found that the conductance of sample 1 increases by strengthening the applied negative voltage, but the conductance of sample 1 declines by enhancing the applied positive voltage. Therefore, I-V curve of FIG. 5 has proved that the electrical characteristics of sample 1 exhibit the short-term potentiation (STP) and short-term depression (STD), i.e., short-term plasticity. On the other hand, FIG. 6 shows a curve graph for showing I-V characteristics of sample 2 of the lead-free metallic halide memristor 1. Similarly, I-V curve of FIG. 6 has proved that the electrical characteristics of sample 2 also exhibit the short-term potentiation and short-term depression.

Figure 7:
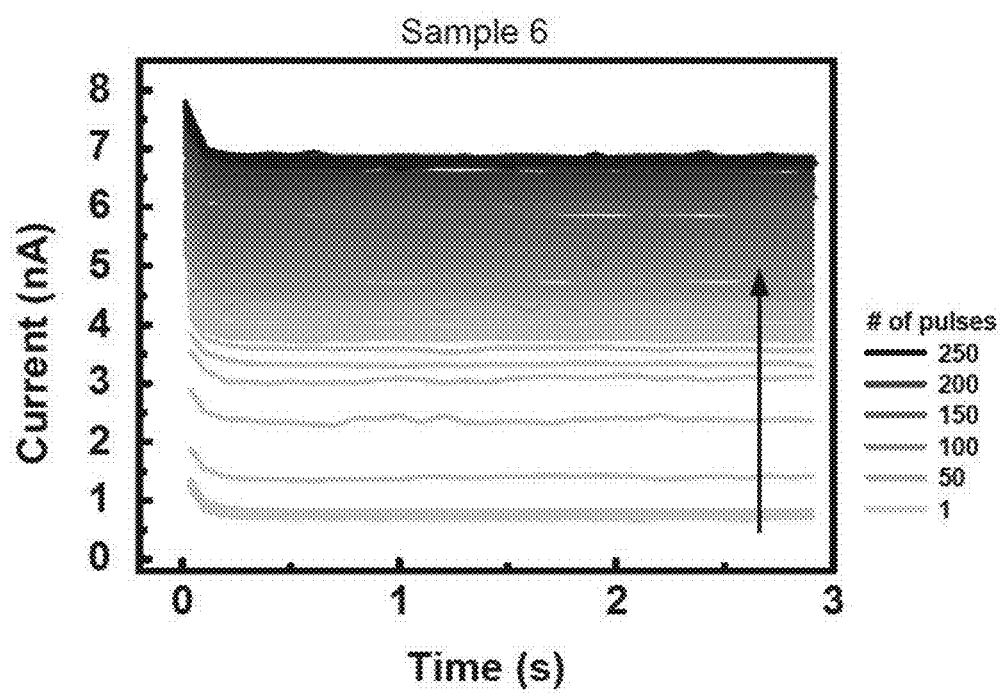
FIG. 7 shows a curve graph of current versus time measured from a sample 6 of the lead-free metallic halide memristor that is applied with numbers of successive identical pulses.
Figure 8:
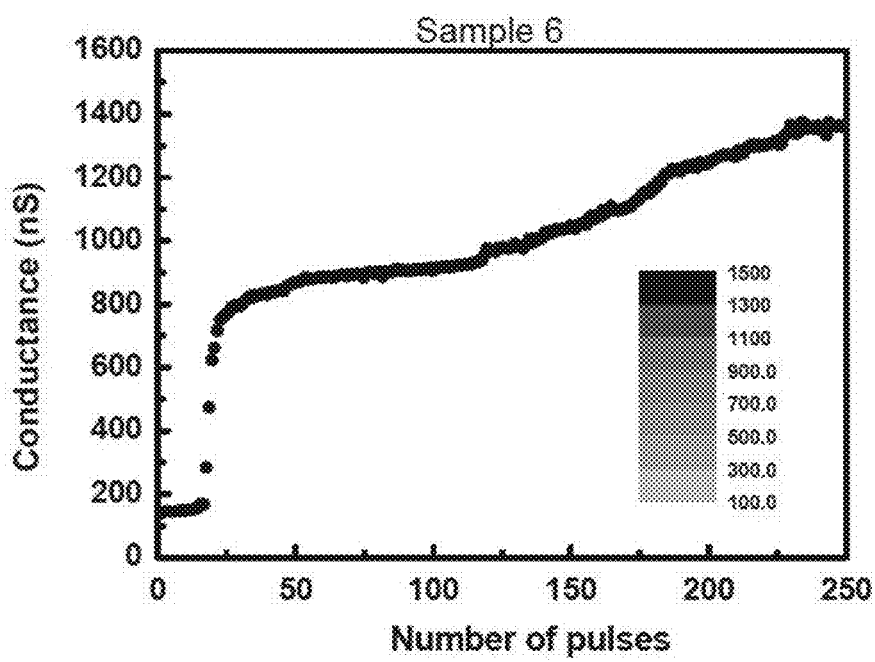
FIG. 8 shows a scatter plot of conductance versus number of pulses measured from the sample 6 of the lead-free metallic halide memristor.

Furthermore, FIG. 7 shows a curve graph of current versus time measured from sample 6 of the lead-free metallic halide memristor 1. According to FIG. 7, it is observed that the conductance of sample 6 ascends gradually by successively applying identical negative pulses to sample 6 and exhibiting great retention in every state, further showing a positive correlation between the current readout from sample 6 and the number of pulses. FIG. 8 shows a scatter plot of conductance versus number of pulses measured from sample 6, which also indicates that it is positively correlated between the two.

Figure 9:
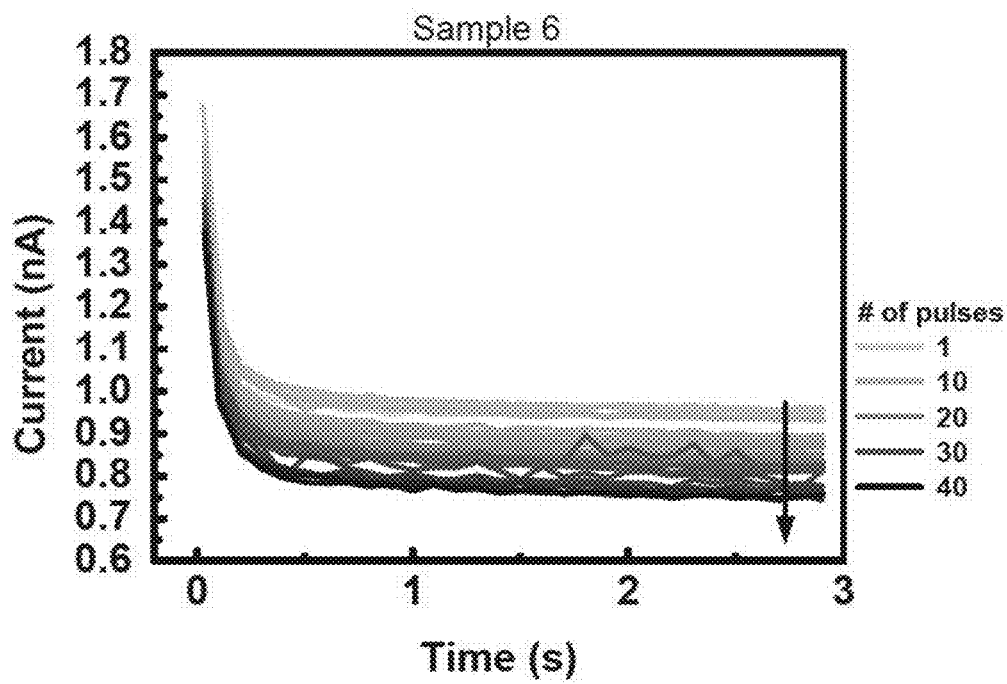
FIG. 9 shows a curve graph of current versus time measured from the sample 6 that is applied with numbers of successive identical pulses.
Figure 10:
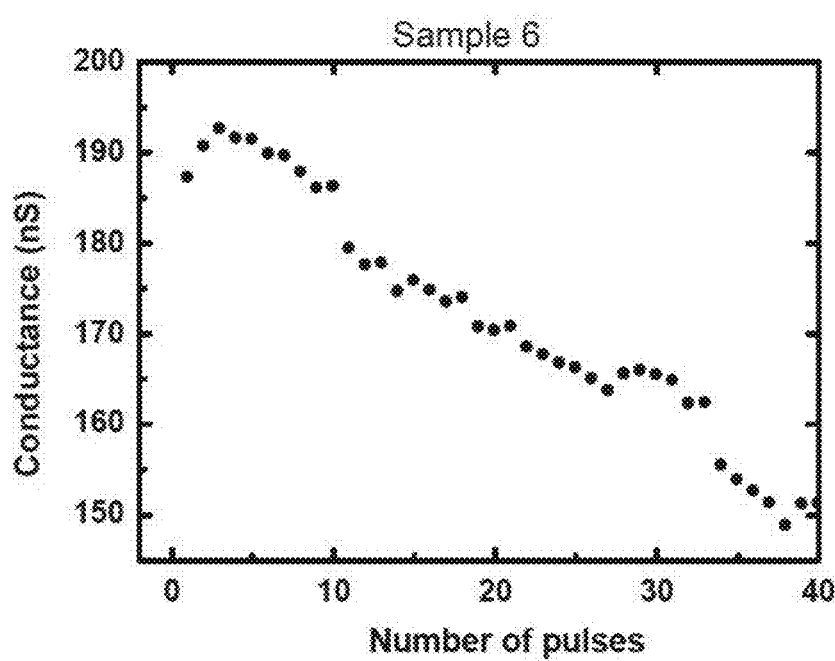
FIG. 10 shows a scatter plot of conductance versus number of pulses measured from the sample 6.

FIG. 9 also shows a curve graph of current versus time measured from sample 6 that is applied with numbers of successive identical pulses. According to FIG. 9, it is observed that the conductance of sample 6 descends gradually by successively applying identical positive pulses to sample 6 and exhibiting great retention in every state, further showing a negative correlation between the current read out from sample 6 and the number of pulses. FIG. 10 shows a scatter plot of conductance versus number of pulses measured from sample 6, which also indicates that it is negatively correlated between the two. As a result, measurement data of FIG. 7, FIG. 8, FIG. 9, and FIG. 10 have proved that the electrical characteristic of sample 6 of the lead-free metallic halide memristor 1 exhibit long-term potentiation (LTP) and long-term depression (LTD), i.e., long-term plasticity. As described in more detail below, the electrical characteristic of gradually-increasing conductance and the electrical characteristic of gradually-decreasing conductance are corresponding to LTP behavior and LTD behavior of synapse, respectively, and these two electrical characteristics can be applied in achieving the weight updating (changing) operation of an artificial neural network (ANN).

In summary, experimental data of FIG. 5, FIG. 6, FIG. 7, FIG. 8, FIG. 9, and FIG. 10 have proved that the lead-free metallic halide memristor 1 of the present invention indeed possesses synaptic plasticity because of showing characteristics of short-term potentiation (STP), short-term depression (STD), long-term potentiation (LTP), long-term depression (LTD) during the experiments. Therefore, this novel lead-free metallic halide memristor 1 has significant potential for being used as an artificial synaptic element so as to be further applied in the manufacture of a neuromorphic computing chip.

Figure 11:
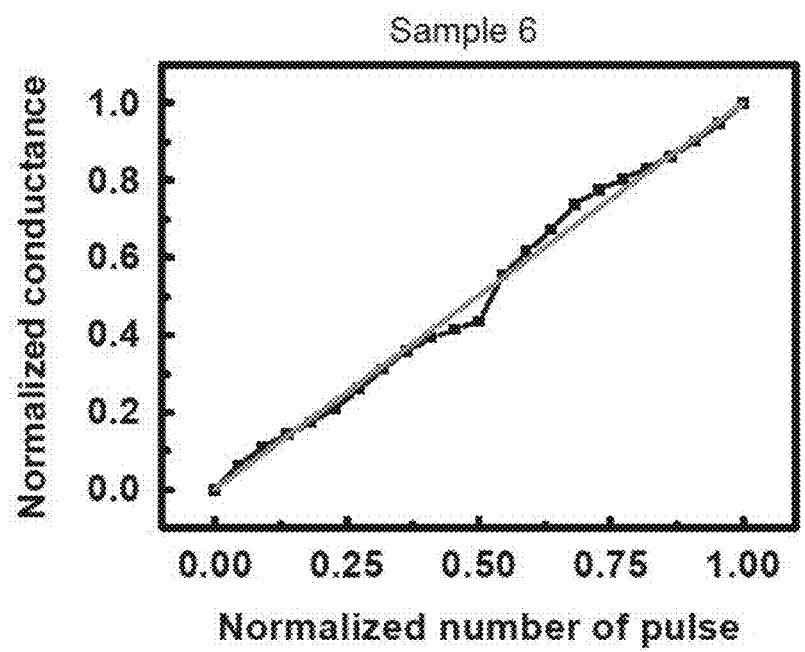
FIG. 11 shows a scatter plot of normalized conductance versus normalized number of pulses measured from the sample 6.
Figure 16:
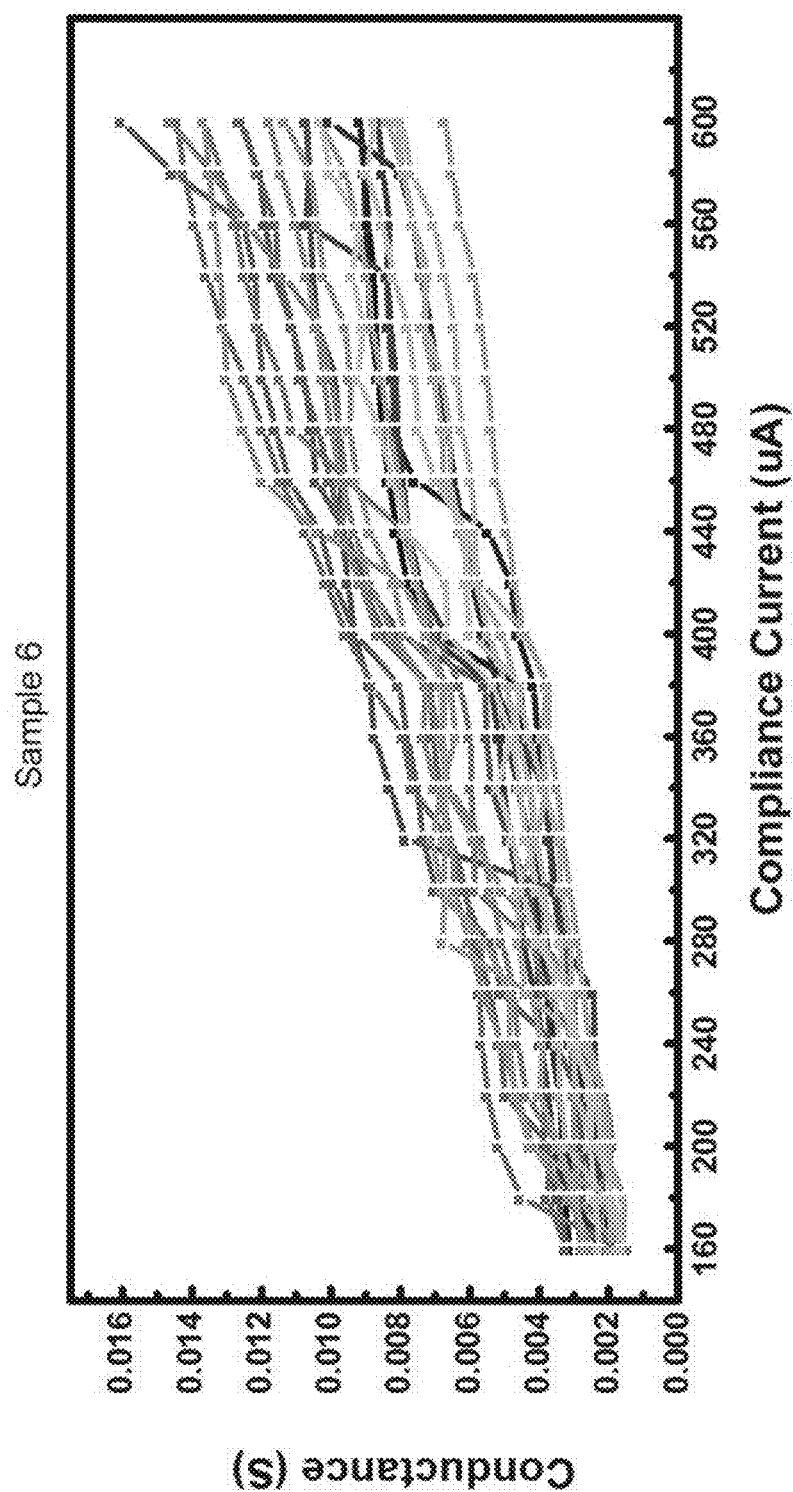
FIG. 16 shows a curve graph of conductance versus compliance current measured from the sample 6.

Furthermore, in order to facilitate the calculation of the conductance linearity of sample 6 of the lead-free metallic halide memristor 1, experimental data of FIG. 16 are further normalized, whereupon FIG. 11 correspondingly shows a scatter plot of normalized conductance versus normalized number of pulses measured from the sample 6. Therefore, according to the normalized data of FIG. 11, the nonlinearity of the conductance states of sample 6 is calculated to be 0.0269, which is much better than conventional memristors. In other words, the lead-free metallic halide memristor exhibits a near-linear conductance modulation.

Figure 12:
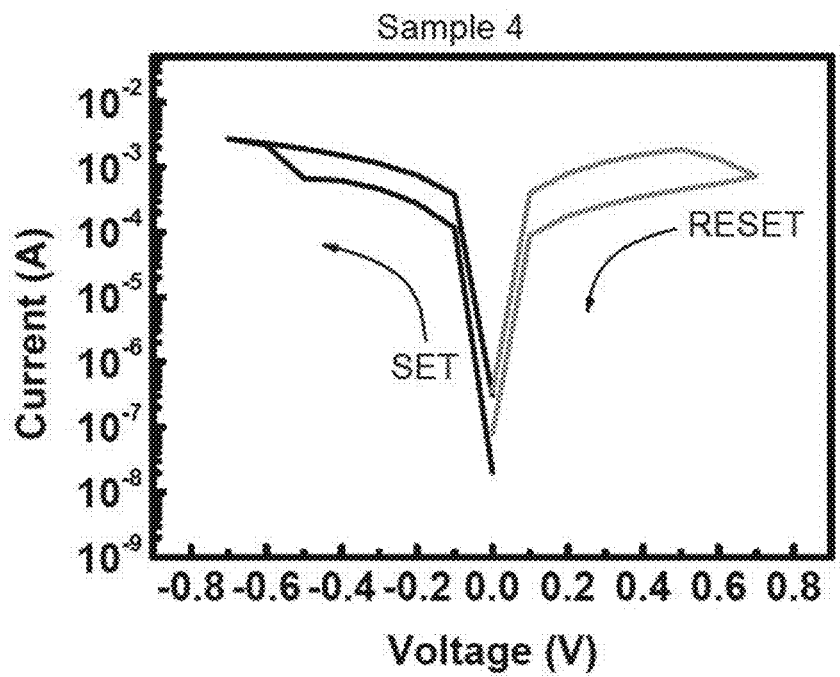
FIG. 12 shows a curve graph for showing I-V characteristics of a sample 4 of the lead-free metallic halide memristor.

Engineers skilled in design and manufacture of memristors certainly know that, as long as an operation voltage applied to the memristor exceeds a threshold voltage, a memristor is allowed to be switched from a low resistance state (LRS) to a high resistance state (HRS), or be switched from HRS to LRS. As described in more detail below, driving the memristor to complete a write (set) operation can make the memristor switch from HRS to LRS. On the contrary, driving the memristor to achieve an erase (reset) operation makes the memristor switch from LRS to HRS. With reference to FIG. 12, there is a curve graph for showing I-V characteristics of sample 4 of the lead-free metallic halide memristor 1. According to I-V curve of FIG. 12, it is found that sample 4 exhibits the electrical characteristic (behavior) of bistable resistive switching. Moreover, there is almost 1-order resistance ratio between HRS and LRS of sample 4.

Figure 13:
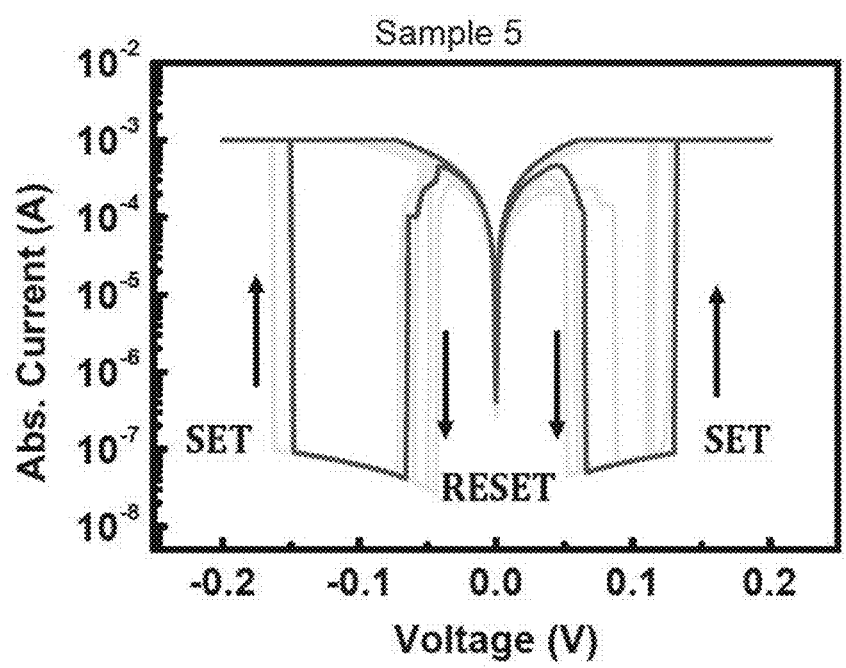
FIG. 13 shows a curve graph for showing I-V characteristics of a sample 5 of the lead-free metallic halide memristor.

Furthermore, FIG. 13 shows a I-V curve graph of sample 5 of the lead-free metallic halide memristor 1, which exhibits bistable, unipolar switching characteristics. According to I-V curve of FIG. 13, it is observed that sample 5 can be programmed to HRS around ±0.08V, and LRS around ±0.15V. Moreover, the resistance ratio between HRS and LRS of sample 5 reaches 6 orders. As a result, experimental data of FIG. 12 and FIG. 13 have proved that the lead-free metallic halide memristor 1 of the present invention indeed can be used as a two-level resistive non-volatile memory, despite different operation methods to some extents.

It is worth mentioning that, during a SET (write) operation of the lead-free metallic halide memristor 1, a larger current of the lead-free metallic halide memristor 1 can be limited by an external compliance current provided by a control circuit. For example, after applying a pulse greater than set voltage to the lead-free metallic halide memristor 1, the lead-free metallic halide memristor 1 switches from HRS to LRS, and then the current readout from the lead-free metallic halide memristor 1 ascends from $\sim 10^{-7}$ A to $\sim 10^{-3}$ A. In such case, the control circuit would adaptively adjust the level of the pulse voltage to make the current be eventually limited in the compliance current (e.g. 100 μA). Therefore, make the memristor stay in various conductance states.

Figure 14:
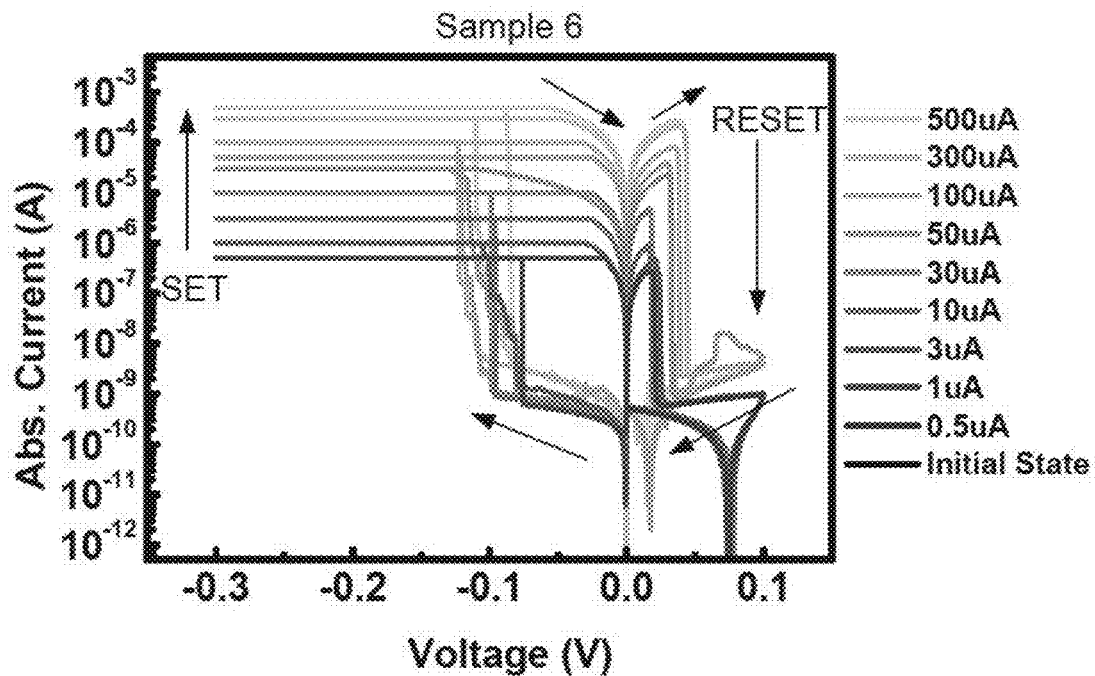
FIG. 14 shows a curve graph for showing I-V characteristics of the sample 6 of the lead-free metallic halide memristor.
Figure 15:
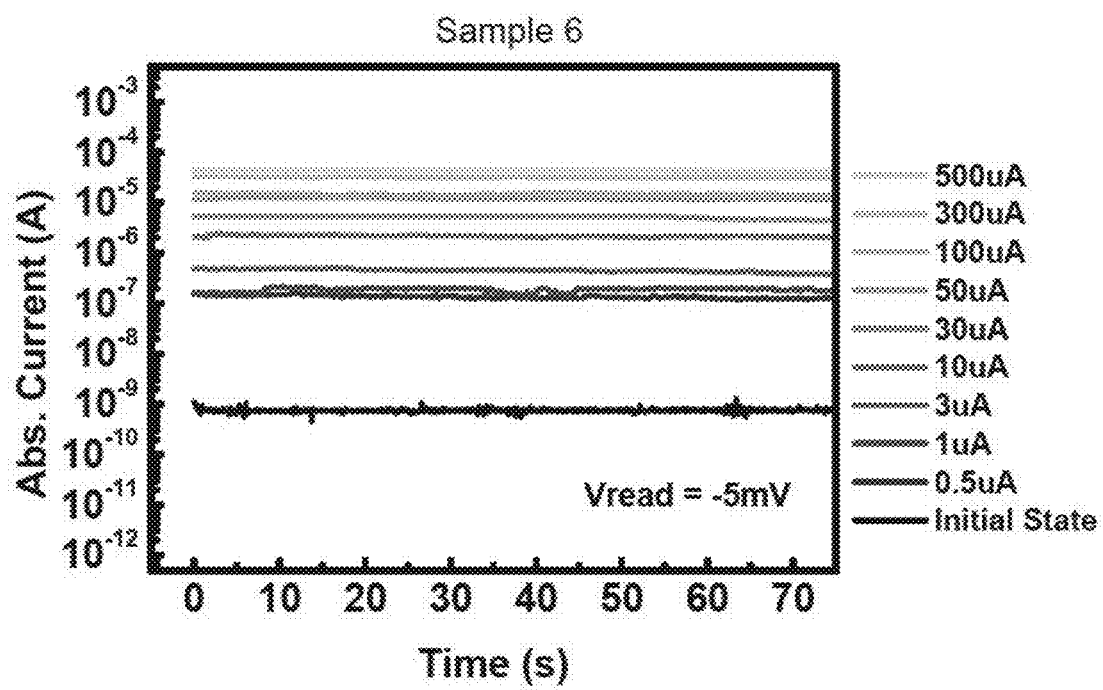
FIG. 15 shows a curve graph of current versus reading time measured from the sample 6.

FIG. 14 depicts a curve graph for showing I-V characteristics of the sample 6 of the lead-free metallic halide memristor under different compliance currents, and FIG. 15 illustrates a curve graph of current versus reading time measured from the sample 6. As FIG. 14 and FIG. 15 show, during the set operation of sample 6, the control circuit adaptively modulates the current of sample 6 according to a designated compliance current, thereby making the current read out from sample 6 approach the compliance current. Therefore, experimental data of FIG. 14 and FIG. 15 have proved that, by using a designated compliance current to limit the current of the lead-free metallic halide memristor 1, the conductance of the lead-free metallic halide memristor 1 becomes discretely adjustable, whereupon the lead-free metallic halide memristor 1 shows the characteristics of multi-level resistive switching.

FIG. 16 shows a curve graph of conductance versus compliance current measured from the sample 6. According to FIG. 16, during successively applying identical negative pulses (e.g., −0.1V) with gradually increasing compliance current (e.g., from 160 μA to 600 μA) so as to make the conductance of sample 6 be correspondingly getting high. Therefore, experimental data of FIG. 16 have proved that the lead-free metallic halide memristor 1 of the present invention shows long-term potentiation (LTP) characteristic with high linearity and high dynamic range.

Figure 17:
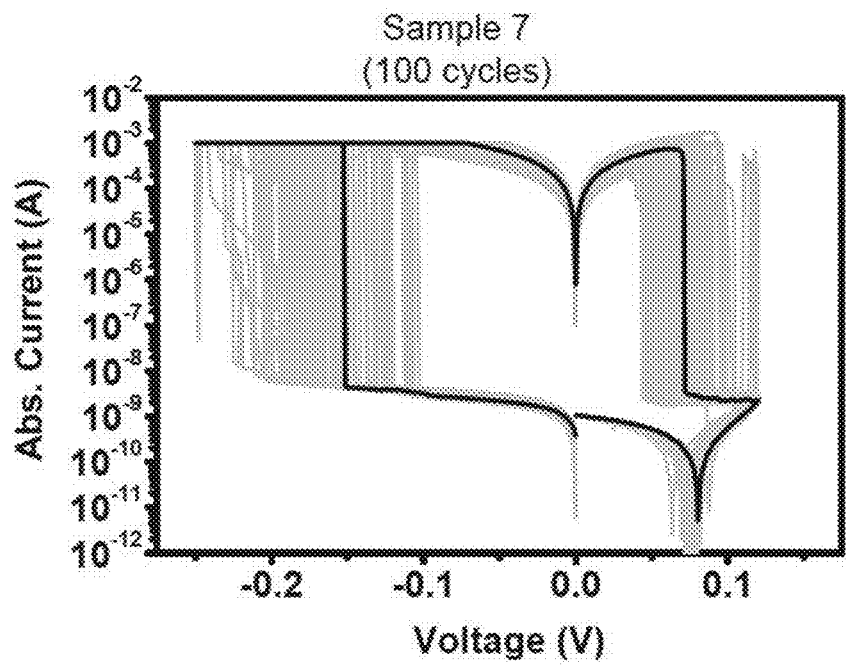
FIG. 17 shows a curve graph for showing I-V characteristics of a sample 7 of the lead-free metallic halide memristor.
Figure 18:
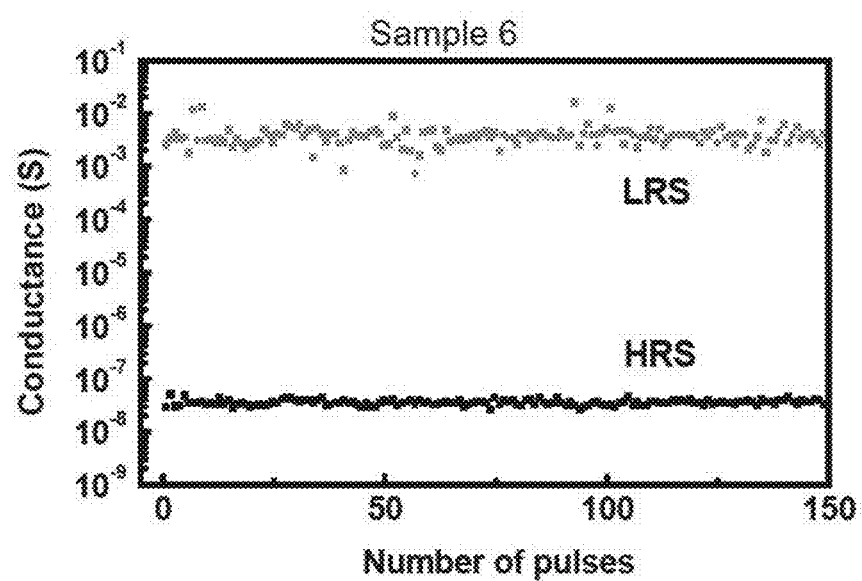
FIG. 18 shows a scatter plot of conductance versus number of pulses measured from the sample 6.

Furthermore, FIG. 17 shows a curve graph for showing I-V characteristics of sample 7 of the lead-free metallic halide memristor 1. According to FIG. 17, during the period of more than 100 times of set/reset cycling characterization, sample 7 of the lead-free metallic halide memristor 1 shows good stability. Moreover, the resistance ratio between HRS and LRS of sample 7 is still greater than 6 orders. On the other hand, FIG. 18 depicts a scatter plot of conductance versus number of pulses measured from the sample 6. After applying a pulse voltage with a low level of −0.1V to sample 6 of the lead-free metallic halide memristor 1, sample 6 switches from HRS to LRS. On the contrary, sample 6 reversely switches from LRS to HRS after receiving a pulse voltage with a level of 0.05V. According to FIG. 18, after more than 150 times of set/reset cycling characterization, the resistance ratio between HRS and LRS of sample 6 is still greater than 6 orders and shows a narrow distribution.

As a result, experimental data of FIG. 17 and FIG. 18 have proved that the lead-free metallic halide memristor can be used as a resistive non-volatile memory including advantages of high resistance ratio (i.e., dynamic range) and outstanding endurance. It is worth mentioning that, following Table (2) lists operation voltages and characteristics of samples 1-9 of the lead-free metallic halide memristor 1.

TABLE (2)

| Sample No. | Write Voltage | Erase Voltage | Dynamic Range | Multi-level switching | Active layer |
|---|---|---|---|---|---|
| 1 | −0.15 V | 0.07 V | >$10^6$ | multiple states | CsI |
| 2 | −0.1 V | 0.05 V | >$10^6$ | multiple states | CsBr |
| 3 | |V| > 0.2 V | | >$10^6$ | >3 states | NaCl |
| 4 | −0.1 V | 0.1 V | ~10 | 2 states | CsCl |
| 5 | −0.1 V | 0.05 V | >$10^6$ | multiple states | CsBr |
| 6 | −0.1 V | 0.05 V | >$10^6$ | multiple states | CsBr |
| 7 | −0.15 V | 0.07 V | >$10^6$ | multiple states | CsI |
| 8 | |V| > 0.2 V | | >$10^6$ | >3 states | NaCl |
| 9 | −0.1 V | 0.05 V | >$10^5$ | >6 states | MgF2 |

In summary, experimental data have proved that the lead-free metallic halide memristor 1 of the present invention indeed possesses synaptic plasticity because of showing characteristics of short-term potentiation (STP), short-term depression (STD), long-term potentiation (LTP), long-term depression (LTD) during the experiments. Therefore, the lead-free metallic halide memristor 1 has significant potential for being used as an artificial synaptic element so as to be further applied in the manufacture of a reservoir computing chip. Moreover, experimental data have also proved that the lead-free metallic halide memristor 1 of the present invention also shows the characteristics of multi-level resistive switching, whereupon the lead-free metallic halide memristor can be further used as non-volatile memory so as to be further applied in the manufacture of a neuromorphic computing chip.

Therefore, through the above descriptions, all embodiments of the lead-free metallic halide memristor and the electronic element comprising the same according to the present invention have been introduced completely and clearly. Moreover, the above description is made on embodiments of the present invention. However, the embodiments are not intended to limit the scope of the present invention, and all equivalent implementations or alterations within the spirit of the present invention still fall within the scope of the present invention.

What is claimed is:

1. A lead-free metallic halide memristor, comprising:
a first electrode layer;
an active layer, being formed on the first electrode layer;
a second electrode layer, being formed on the active layer; and
a first interfacial modification layer, being formed between the first electrode layer and the active layer, and being made of a material selected from a group consisting of oxide semiconductor and organic semiconductor;
wherein the active layer is made of a metallic halide material comprising a general formula $MX_n$;
wherein M is selected from a group consisting of Li, Na, K, Rb, Cs, Mg, and X being selected from a group consisting of F, Cl, Br, and I;
wherein n is 1 or 2.

2. The lead-free metallic halide memristor of claim 1, wherein the first electrode layer and the second electrode layer are a bottom layer and a top layer of the lead-free metallic halide memristor, respectively.

3. The lead-free metallic halide memristor of claim 1, wherein the first electrode layer and the second electrode layer are a top layer and a bottom layer of the lead-free metallic halide memristor, respectively.

4. The lead-free metallic halide memristor of claim 3, wherein the bottom layer is formed on a substrate.

5. The lead-free metallic halide memristor of claim 1, further comprising a second interfacial modification layer formed between the active layer and the second electrode layer, and the second interfacial modification layer is also made of the material.

6. An electronic element, being selected from a group consisting of artificial synapse, two-level resistive non-volatile memory and multi-level resistive non-volatile memory;
characterized in that the electronic element comprises:
a first electrode layer;
an active layer, being formed on the first electrode layer;
a second electrode layer, being formed on the active layer; and
a first interfacial modification layer, being formed between the first electrode layer and the active layer, and being made of a material selected from a group consisting of oxide semiconductor and organic semiconductor;
wherein the active layer is made of a metallic halide material comprising a general formula $MX_n$;
wherein M is selected from a group consisting of Li, Na, K, Rb, Cs, Mg, and X being selected from a group consisting of F, Cl, Br, and I;
wherein n is 1 or 2.

7. An electronic chip, being selected from a group consisting of neuromorphic computing chip and reservoir computing chip;
characterized in that the electronic chip comprises a plurality of memristor elements, and each said memristor element comprising:
a first electrode layer;
an active layer, being formed on the first electrode layer;
a second electrode layer, being formed on the active layer; and
a first interfacial modification layer, being formed between the first electrode layer and the active layer, and being made of a material selected from a group consisting of oxide semiconductor and organic semiconductor;
wherein the active layer is made of a metallic halide material comprising a general formula $MX_n$;

wherein M is selected from a group consisting of Li, Na, K, Rb, Cs, Mg, and X being selected from a group consisting of F, Cl, Br, and I;

wherein n is 1 or 2.

* * * * *